(12) United States Patent
Chiu et al.

(10) Patent No.: US 9,362,244 B2
(45) Date of Patent: Jun. 7, 2016

(54) WIRE TAIL CONNECTOR FOR A SEMICONDUCTOR DEVICE

(71) Applicant: SANDISK INFORMATION TECHNOLOGY (SHANGHAI) CO., LTD., Shanghai (CN)

(72) Inventors: Chin Tien Chiu, Taichung (TW); Cheeman Yu, Fremont, CA (US); Hem Takiar, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/375,408

(22) PCT Filed: Oct. 22, 2012

(86) PCT No.: PCT/CN2012/083303
§ 371 (c)(1),
(2) Date: Jul. 29, 2014

(87) PCT Pub. No.: WO2014/063287
PCT Pub. Date: May 1, 2014

(65) Prior Publication Data
US 2015/0001739 A1   Jan. 1, 2015

(51) Int. Cl.
*H01L 23/48* (2006.01)
*H01L 23/00* (2006.01)
(Continued)

(52) U.S. Cl.
CPC .............. *H01L 24/06* (2013.01); *H01L 21/561* (2013.01); *H01L 21/82* (2013.01); *H01L 23/3121* (2013.01); *H01L 24/03* (2013.01); *H01L 24/24* (2013.01); *H01L 24/48* (2013.01); *H01L 24/49* (2013.01); *H01L 24/82* (2013.01); *H01L 24/85* (2013.01); *H01L 24/92* (2013.01); *H01L 24/97* (2013.01); *H01L 25/0657* (2013.01);
(Continued)

(58) Field of Classification Search
CPC .......... H01L 24/06; H01L 24/82; H01L 25/50
See application file for complete search history.

(56) References Cited

U.S. PATENT DOCUMENTS 6,034,438 A    3/2000  Petersen
9,099,317 B2 *  8/2015  Nondhasitthichai .. H01L 21/561
(Continued)

FOREIGN PATENT DOCUMENTS

KR   100886200   2/2009
TW   200836306   9/2008
(Continued)

OTHER PUBLICATIONS

International Search Report and Written Opinion dated Aug. 1, 2013 in International Patent Application No. PCT/CN2012/083303.
(Continued)

*Primary Examiner* — Trung Q Dang
*Assistant Examiner* — Wasiul Haider
(74) *Attorney, Agent, or Firm* — Vierra Magen Marcus LLP

(57) ABSTRACT

A memory device, and a method of making the memory device, are disclosed. The memory device is fabricated by mounting one or more semiconductor die on a substrate, and wire bonding the die to the substrate. The die and wire bonds are encapsuated, and the encapsulated device is singulated. The wire bonds are severed during the singulation step, and thereafter the severed wire bonds are connected to the substrate by external connectors on one or more surfaces of the molding compound.

15 Claims, 12 Drawing Sheets

(51) Int. Cl.
*H01L 21/56* (2006.01)
*H01L 21/82* (2006.01)
*H01L 23/31* (2006.01)
*H01L 25/065* (2006.01)
*H01L 25/00* (2006.01)
H01L 23/14 (2006.01)
H01L 23/495 (2006.01)
H01L 23/538 (2006.01)

(52) U.S. Cl.
CPC ............... *H01L25/50* (2013.01); *H01L 23/145* (2013.01); *H01L 23/49575* (2013.01); *H01L 23/5386* (2013.01); *H01L 24/73* (2013.01); *H01L 2224/03011* (2013.01); *H01L 2224/04042* (2013.01); *H01L 2224/05554* (2013.01); *H01L 2224/24145* (2013.01); *H01L 2224/32145* (2013.01); *H01L 2224/32225* (2013.01); *H01L 2224/32245* (2013.01); *H01L 2224/48091* (2013.01); *H01L 2224/48227* (2013.01); *H01L 2224/49113* (2013.01); *H01L 2224/49175* (2013.01); *H01L 2224/73265* (2013.01); *H01L 2224/78301* (2013.01); *H01L 2224/85001* (2013.01); *H01L 2224/85947* (2013.01); *H01L 2224/85986* (2013.01); *H01L 2224/92247* (2013.01); *H01L 2224/97* (2013.01); *H01L 2225/0651* (2013.01); *H01L 2225/06527* (2013.01); *H01L 2225/06551* (2013.01); *H01L 2225/06562* (2013.01); *H01L 2225/06565* (2013.01); *H01L 2924/00014* (2013.01); *H01L 2924/12042* (2013.01); *H01L 2924/1431* (2013.01); *H01L 2924/1434* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

2010/0140811 A1 6/2010 Leal et al.
2010/0148340 A1* 6/2010 Takano et al. .................. 257/686

FOREIGN PATENT DOCUMENTS

TW 201010045 3/2010
TW 201013802 4/2010
TW 201232730 8/2012

OTHER PUBLICATIONS

Response to Office Action filed Aug. 18, 2015 in Taiwain Patent Application No. 102137958.
Office Action dated May 20, 2015 in Taiwan Patent Application No. 102137958.

* cited by examiner

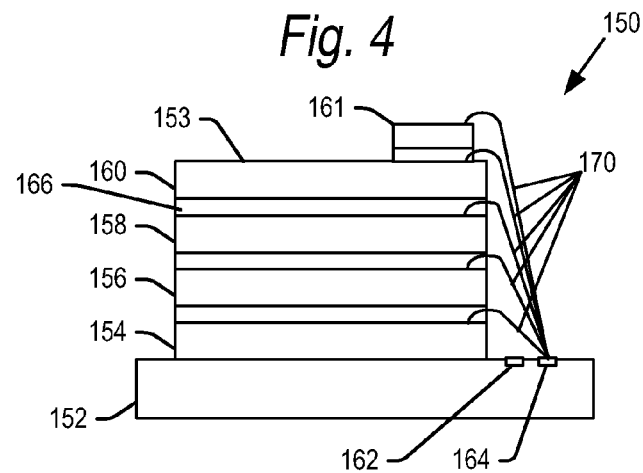
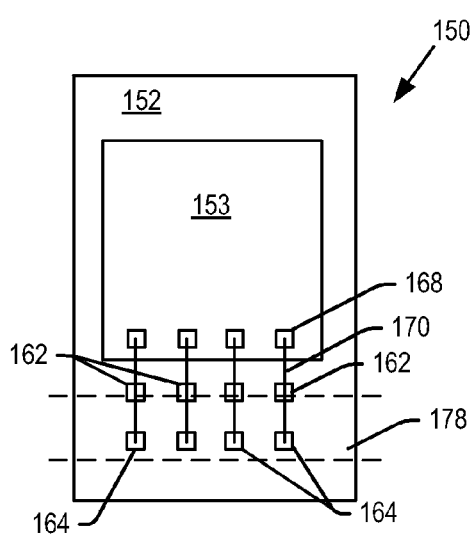 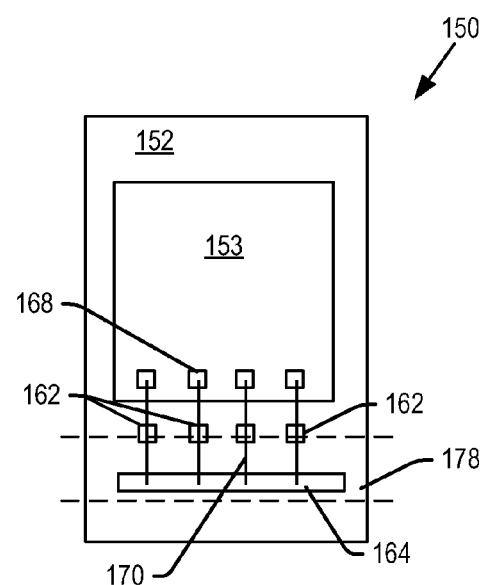

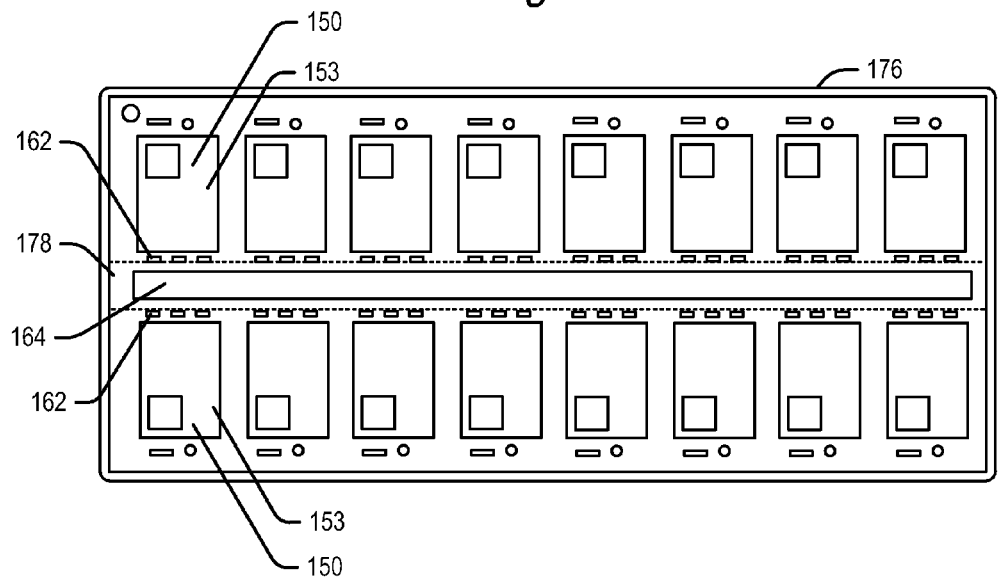
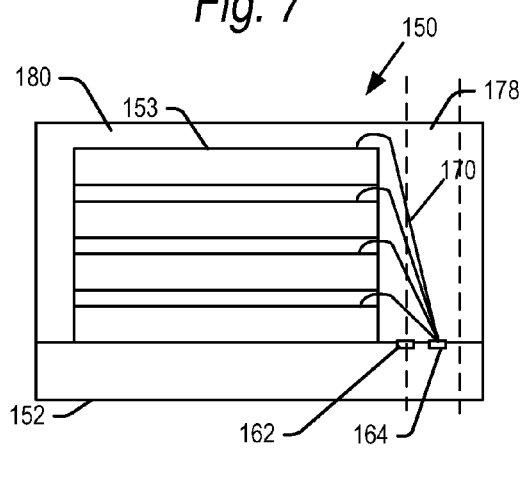
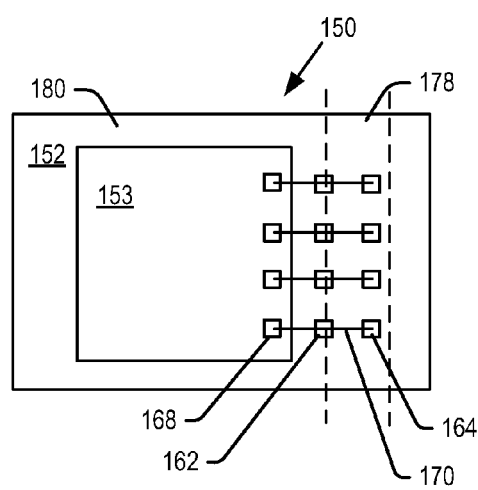

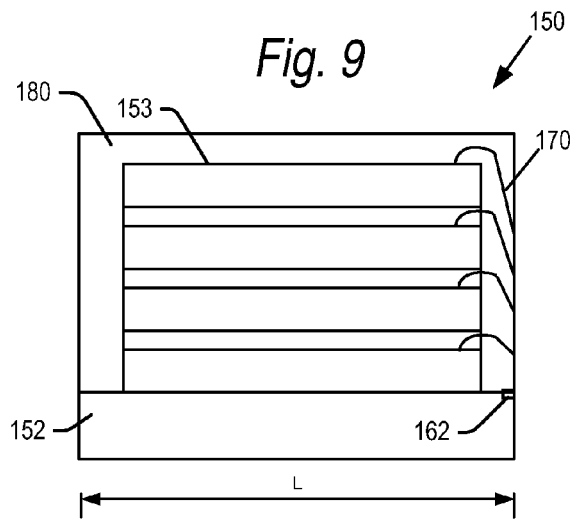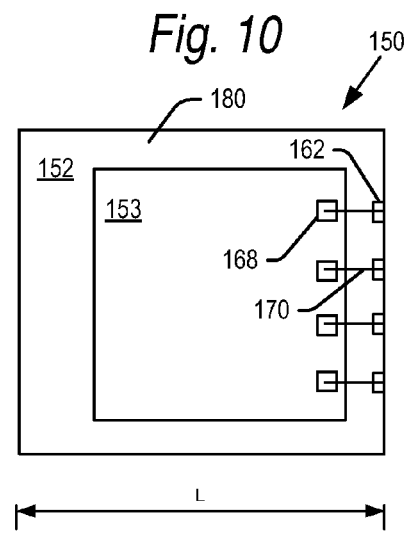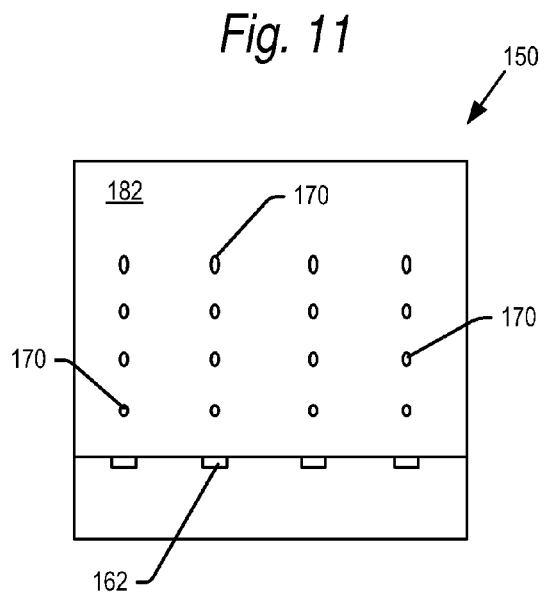

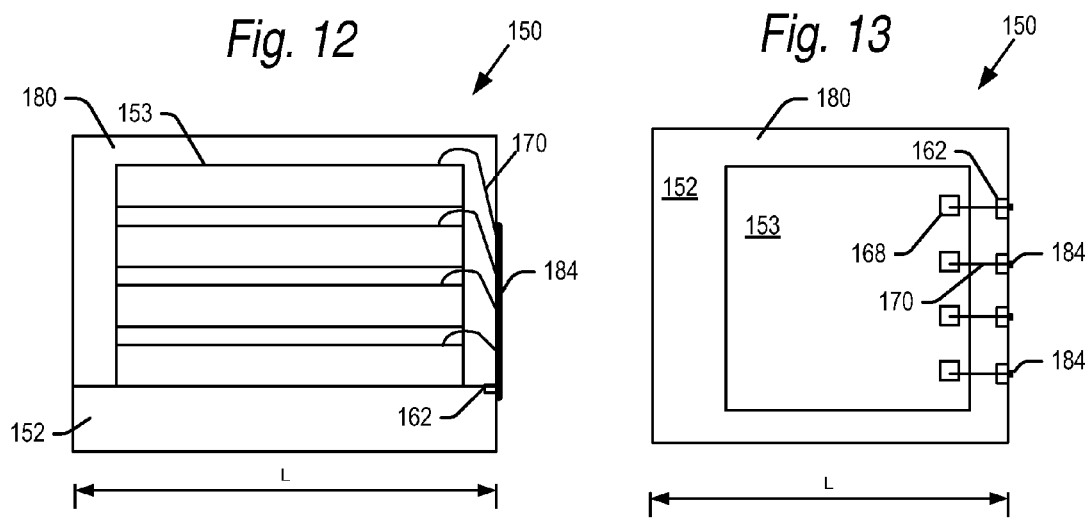
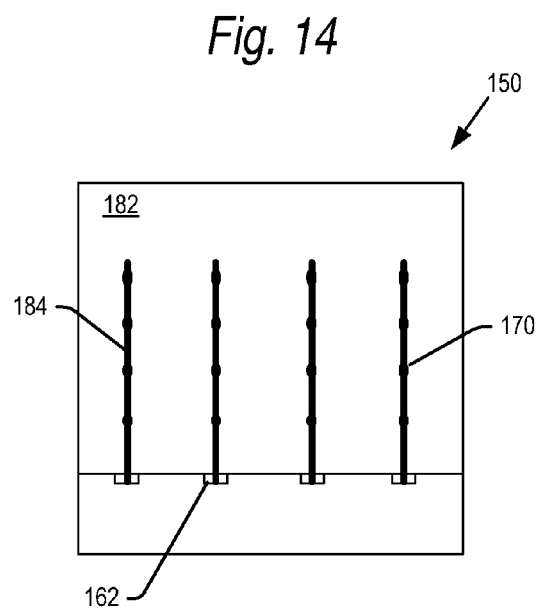

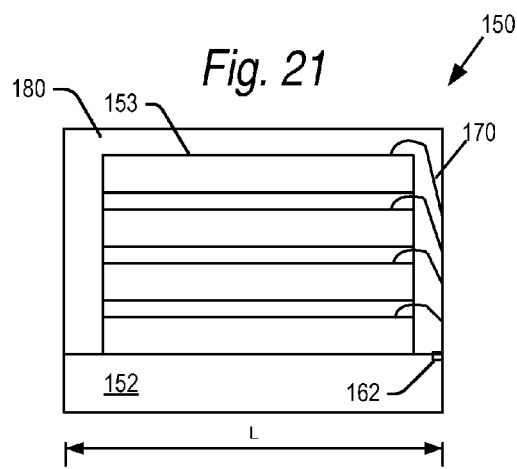
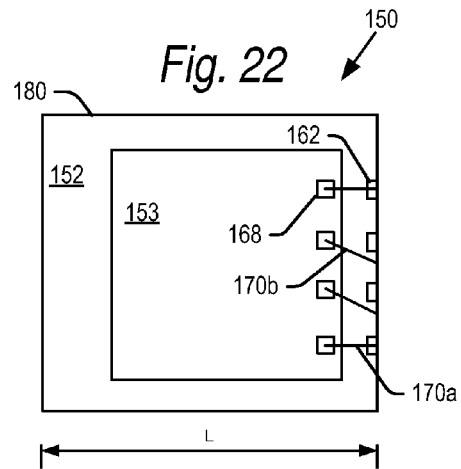
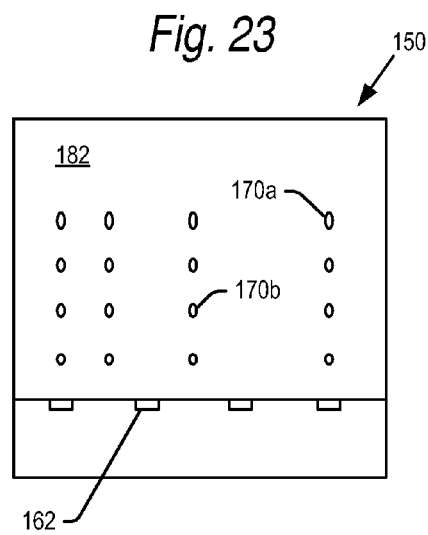
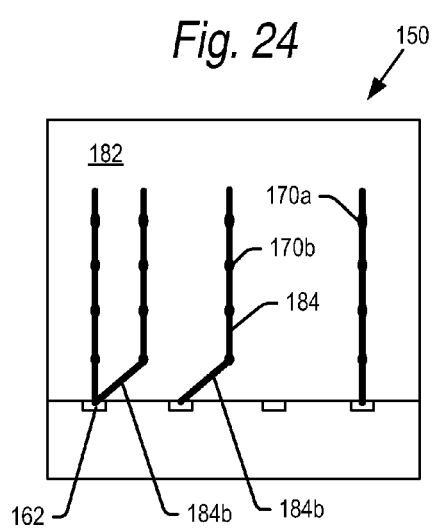

WIRE TAIL CONNECTOR FOR A SEMICONDUCTOR DEVICE

BACKGROUND OF THE INVENTION

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die 22, 24 mounted to a substrate 26. It is known to layer semiconductor die on top of each other either with an offset (prior art FIG. 1) or in a stacked configuration. In a stacked configuration, the die 22, 24 may be separated by a spacer layer 34 (prior art FIG. 2), or by a film layer in which the wire bonds from the lower die may embed. Although not shown in FIGS. 1 and 2, the semiconductor die are formed with die bond pads on an upper surface of the die. Substrate 26 may be formed of an electrically insulating core sandwiched between upper and lower conductive layers.

The upper and/or lower conductive layers may be etched to form conductance patterns including electrical leads and bond fingers. Wire bonds may be bonded between the die bond pads of the semiconductor die 22, 24 and the bond fingers of the substrate 26 to electrically couple the semiconductor die to the substrate. The electrical leads on the substrate in turn provide an electrical path between the die and a host device. Once electrical connections between the die and substrate are made, the assembly is then typically encased in a molding compound (not shown) to provide a protective package.

The length of the substrate 26, and consequently the overall length of the encapsulated package 20, is bigger than the die 22, 24. One reason for this is that space is needed between the die and wire bond position on the substrate for a wire bond capillary 32 (FIG. 2) to form the wire bonds between the substrate 26 and the die 22, 24. If the wire bond to the substrate 26 is formed too close to the die, the capillary 32 will contact one of the die in the die stack before forming the bond on the substrate. The higher the die stack, the more space is required between the die and wire bond position on the substrate.

BRIEF DESCRIPTION OF THE DRAWINGS

FIG. 4 is a side view of a die stack mounted and wire bonded to anchor pads on the substrate during a first phase of fabrication.

FIG. 5A is a top view of the die stack and substrate shown in FIG. 4.

FIG. 5B is a top view of an alternative embodiment to that shown in FIG. 5A.

FIGS. 6A, 6B and 6C are top views of alternative configurations of a panel of memory devices, prior to encapsulation, according to embodiments of the present disclosure.

FIG. 7 is a side view as in FIG. 4 further including molding compound.

FIG. 8 is a top view of the die stack and substrate shown in FIG. 7.

FIG. 9 is a side view as in FIG. 7 where a portion of the molding compound, wire bonds and substrate has been singulated from the device.

FIG. 10 is a top view of the semiconductor device shown in FIG. 9.

FIG. 11 is an end view of the semiconductor device shown in FIG. 9.

FIG. 12 is a side view as in FIG. 9 further showing external connectors formed on the exterior of the molding compound according to embodiments of the present disclosure.

FIG. 13 is a top view of the semiconductor device shown in FIG. 12.

FIG. 14 is an end view of the semiconductor device shown in FIG. 12.

FIGS. 21, 22 and 23 are side, top and end views, respectively, of the semiconductor device of FIGS. 18-20 after singulation and removal of a portion of the molding compound, bond wires and substrate.

FIG. 24 is an end view as in FIG. 23 further showing the external connectors.

DETAILED DESCRIPTION OF THE INVENTION

Embodiments will now be described with reference to FIGS. 3 through 29, which relate to a semiconductor device including a small length and/or width. In examples, the small length and/or width may be achieved by forming bond wires between semiconductor die in a die stack and anchor pads on the substrate. After encapsulation, the semiconductor device may be singulated in a way that removes the anchor pads and severs the bond wires along their length to achieve an overall small length and/or width. The severed bond wires are exposed in a surface of the molding compound, and may then be electrically coupled to contact pads on the substrate via external connectors formed on a surface of the molding compound.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" as may be used herein are for convenience and illustrative purposes only, and are not meant to limit the description of the invention inasmuch as the referenced item can be exchanged in position.

Figure 3:
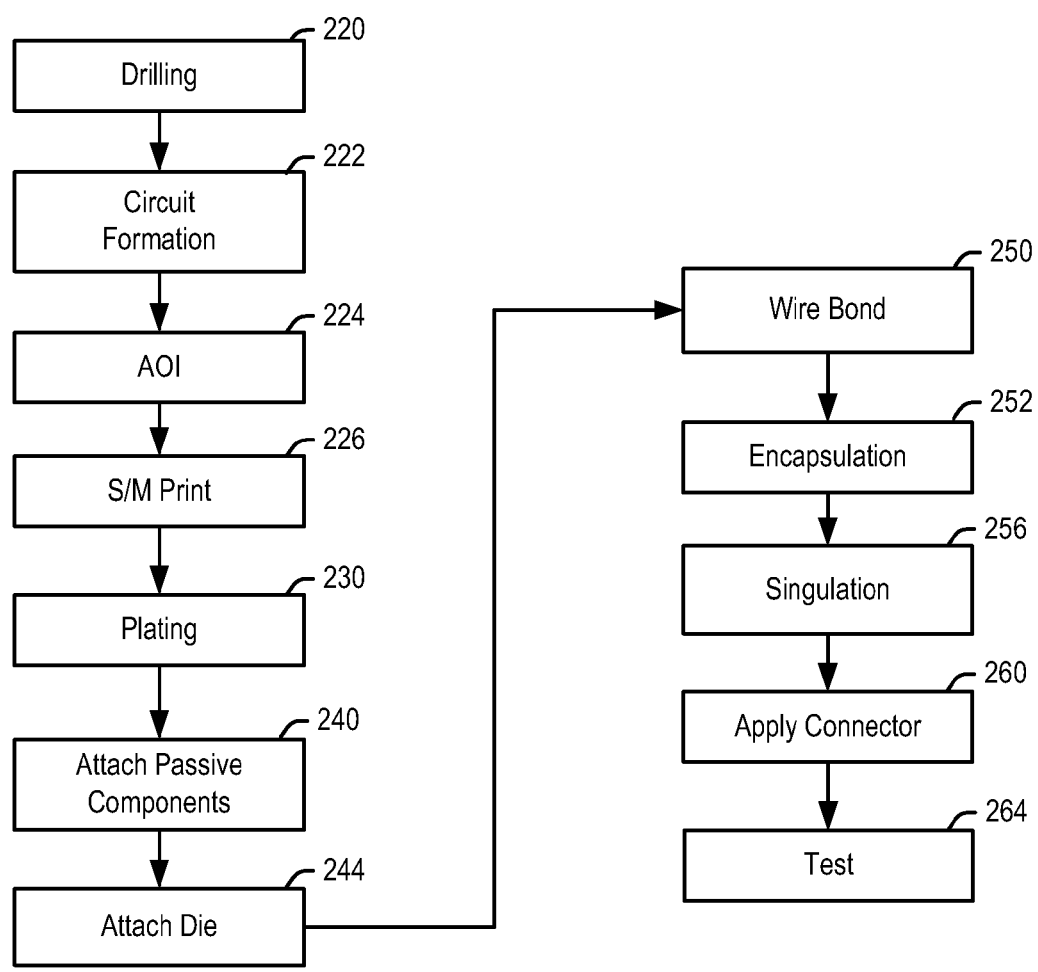
FIG. 3 is a flowchart of an embodiment of the present disclosure.

FIG. 3 is a flowchart of an embodiment for forming a small footprint memory device. Referring initially to FIGS. 4 and 5A, the semiconductor device 150 includes a substrate 152 on which are mounted a die stack 153 having semiconductor die 154, 156, 158 and 160. While the die stack 153 shown in the figures includes four memory die and a controller die, the die stack may include more or less die in further embodiments. Also, although FIGS. 4 and 5A (and other figures) show an individual semiconductor device 150, it is understood that the device 150 may be batch processed along with a plurality of other devices 150 on a substrate panel 176 (FIG. 6A) as explained below to achieve economies of scale. The number of rows and columns of devices 150 on the substrate panel 176 may vary.

The substrate panel 176 begins with a plurality of substrates 152 (again, one such substrate is shown in FIGS. 4 and 5A). The substrate 152 may be a variety of different chip carrier mediums, including a printed circuit board (PCB), a leadframe or a tape automated bonded (TAB) tape. Where substrate 152 is a PCB, the substrate may be formed of a core having a top conductive layer and a bottom conductive layer. The core may be formed of various dielectric materials such as for example, polyimide laminates, epoxy resins including FR4 and FR5, bismaleimide triazine (BT), and the like. Although not critical to the present invention, the core may have a thickness of between 40 microns (μm) to 200 μm, although the thickness of the core may vary outside of that range in alternative embodiments. The core may be ceramic or organic in alternative embodiments.

The conductive layers surrounding the core may be formed of copper or copper alloys, plated copper or plated copper alloys, copper plated steel, or other metals and materials known for use on substrate panels. The conductive layers may have a thickness of about 10 μm to 25 μm, although the thickness of the layers may vary outside of that range in alternative embodiments.

In a step 220, the substrate 152 is drilled to define through-hole vias (not shown) in the substrate 152. The substrate 152 may be formed of a number of conductive layers, and the vias may communicate electrical signals from one layer to another. Conductance patterns are next formed on one or more conductive layers in step 222. The conductance pattern (s) may include electrical traces (not shown), contact pads 162 and one or more anchor pads 164 (some of which pads 162, 164 are numbered in the figures). The number of contact pads 162 and anchor pads 164 shown are by way of example, and the substrate 152 may include more contact pads and/or anchor pads than are shown in the figures, and they may be in different locations than are shown in the figures. The conductance pattern on the top and/or bottom surfaces of the substrate 152 may be formed by a variety of known processes, including for example various photolithographic processes.

In an embodiment shown in FIG. 5A, there may be the same number of contact pads 162 and anchor pads 164. The contact pads 162 may be aligned with each other in a first row, and the anchor pads 164 may be aligned with each other in a second row. Each contact pad 162 may have a corresponding anchor pad 164. In further embodiments, the number of contact pads 162 may be different than the number of anchor pads 164. As one example shown in FIG. 5B, there may be multiple contact pads 162, but a single anchor pad 164 having a length of several of the anchor pads 164 of FIG. 5A together.

Figure 1:
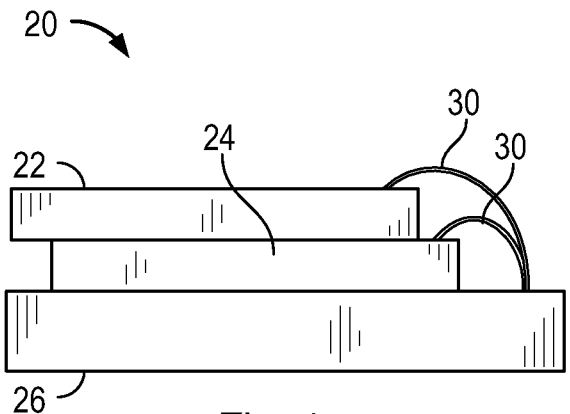
FIGS. 1 and 2 are prior art edge views of two conventional semiconductor package designs with the molding compound omitted.
Figure 2:
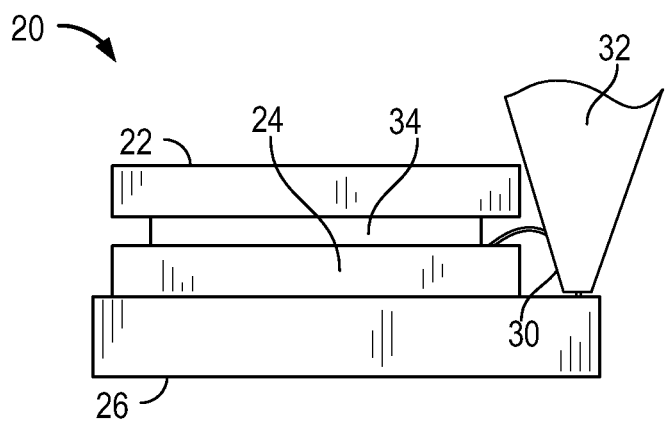

Referring again to the flowchart of FIG. 2, the substrate 152 may next be inspected in an automatic optical inspection (AOI) in step 224. Once inspected, a solder mask may be applied to the substrate in step 226 leaving the contact pads 162 and anchor pads 164 exposed. After the solder mask is applied, the contact pads 162, anchor pads 164 and any other solder areas on the conductance patterns may be plated with a Ni/Au or the like in step 230 in a known electroplating or thin film deposition process.

It is known that plating contact pads on a substrate provides a better electrical connection between the contact pad and a bond wire soldered thereto. However, as explained below, it is not necessary to provide an optimal electrical connection between the bond wire and the anchor pads 164, and the bond wires are not soldered to the contact pads 162. Accordingly, the plating of contact pads 162 and/or anchor pads 164 may be omitted in further embodiments. Alternatively, the contact pads 162 and/or anchor pads 164 may be plated, but with a material other than Ni/Au.

Passive components (not shown) may next be affixed to the top surface of the substrate 152 in a step 240. The one or more passive components may be mounted on the substrate 152 and electrically coupled to the conductance pattern as by connection to contact pads in known surface mount and reflow processes. The passive components may include for example one or more capacitors, resistors and/or inductors, though other components are contemplated.

As seen for example in FIG. 4 and as mentioned above, one or more semiconductor die may next be affixed to the top surface of the substrate 152 in a step 244. The embodiment of FIG. 5 includes a die stack 153 off our flash memory die 154, 156, 158 and 160, and a controller die 161. The memory die 154-160 may be for example flash memory chips (NOR/NAND), though other types of memory die are contemplated. Controller die 161 may for example be an ASIC. The controller die 161 and wire bonds therefrom are omitted from other drawings for clarity.

The die in die stack 153 may be stacked generally aligned with each other and separated by a film layer 166 (one of which layers is numbered in FIG. 4) allowing wire bonds to be formed from the die bond pads to the substrate from each die in die stack 153 as explained below. In further embodiments, though possibly enlarging the footprint of the semiconductor device, the die may be stacked in a staggered, step configuration, and the film layer 166 may be omitted.

After the die in die stack 153 have been mounted on the substrate (or after each die in the die stack has been mounted), bond wires 170 may be connected between die bond pads 168 on each die and the one or more anchor pads 164 in step 250.

The one or more anchor pads 164 may be spaced from the die stack 153 a minimum distance so that all wire bonds may be formed with a wire bond capillary (not shown) without danger of contact with a die in the die stack. This distance will vary depending on factors including the number of die in the die stack 153. The one or more anchor pads 164 may be spaced from the die stack 153 more than this minimum distance in further embodiments.

Although not wire bonded to contact pad 162, in one example, a bond wire may pass straight over a contact pad between a die bond pad and an anchor pad. That is, as seen in the top view of FIG. 5A, in one example, a die bond pad 168, a contact pad 162 and an anchor pad 164 may be aligned with each other, so that contact pad 162 and corresponding anchor pad 164 may be connected with a shortest length bond wire 170. This bond wire 170 may pass straight over a contact pad 162. As explained below, a die bond pad 168 may not be aligned with an anchor pad with which it is coupled by a bond wire 170.

It is not necessary that the anchor pads 164 electrically isolate the respective bond wires 170 on each die from each other. Thus, for example as shown in the embodiment of FIG. 5B, several die bond pads 168 may be coupled to a single anchor pad 164 via multiple bond wires 170.

Figure 6A:
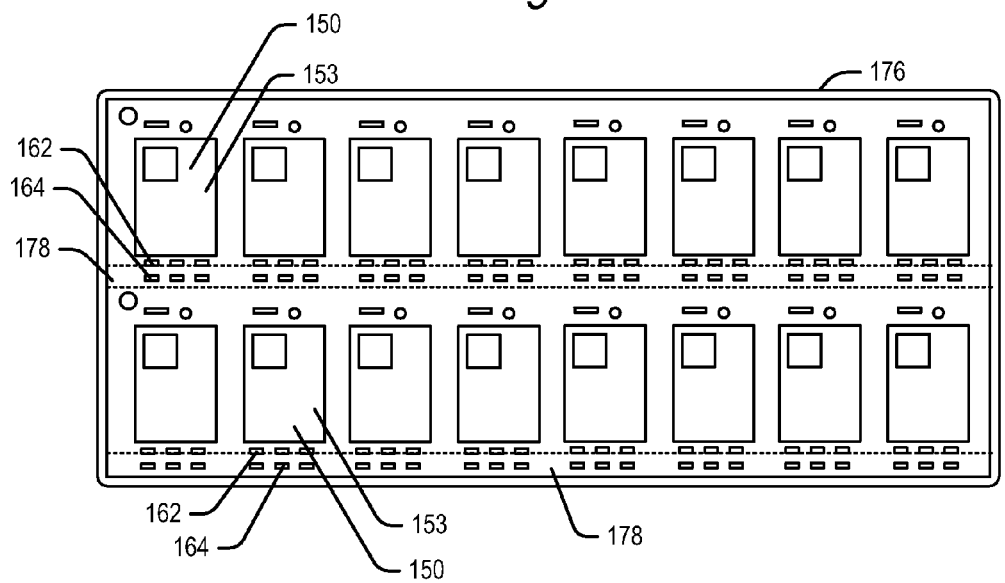

FIG. 6A shows a panel 176 of semiconductor devices 150. The die stack 153, contact pads 162 and anchor pads 164 are numbered on two of the semiconductor devices 150. As seen in the view of an individual semiconductor device 150 in FIG. 5A, and in the panel 176 of devices in FIG. 6A, there is a keep-out area 178 defined on the substrate 152 for each semiconductor device 150. The keep-out area 178 is an area on the substrate 152 which may be sawed off or sawed through when the individual semiconductor devices 150 are singulated from the panel as explained below. Conventionally, the keep-out area on the substrate 152 is devoid of structure such as contact pads. However, in accordance with the present disclosure, the anchor pads 164 may be formed in the keep-out area 178, and removed during singulation as explained below. In conventional designs, the contact pads receiving wire bonds could not be located in this keep-out area, and the size of the substrate needed to be larger than in the present technology so that the substrate could be singulated while leaving the contact pads receiving wire bonds intact.

FIG. 6A shows two rows of semiconductor devices 150, each row including a keep-out area 178 having anchor pads 164. It is understood that there may be a single row of semiconductor devices and a single keep-out area including anchor pads 164. Further, the panel 176 may have more than two rows of semiconductor devices, each row including a keep-out area having anchor pads 164. Although not shown, there may be columns of keep-out areas 178, vertically oriented from the perspective of FIG. 6A, between adjacent semiconductor devices 150. These vertical keep-out areas 178 may also or alternatively include anchor pads to which bond wires 170 are attached.

Figure 6B:
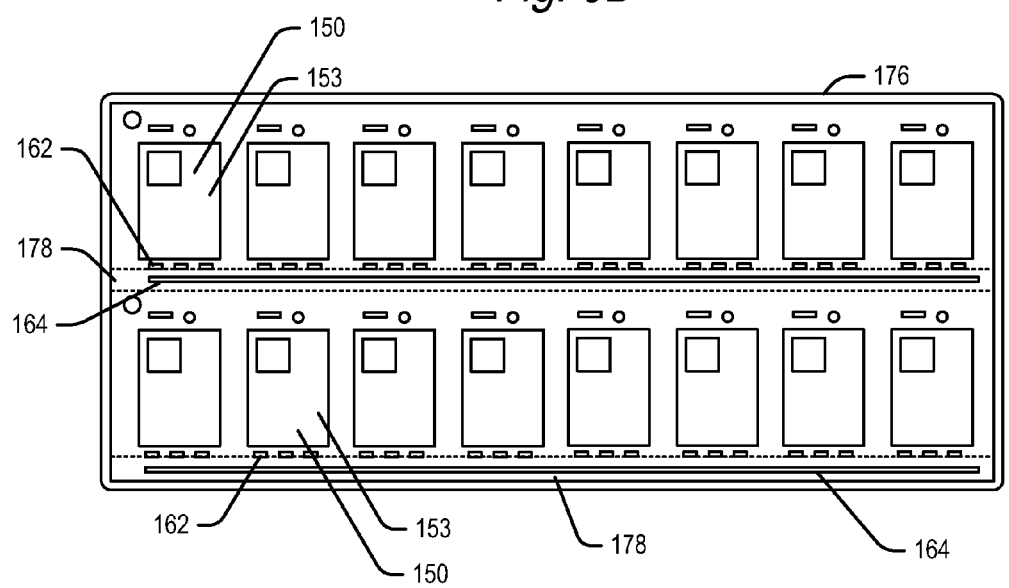

In the embodiment of FIG. 6A, each semiconductor device 150 in each row includes one or more anchor pads 164. FIG. 6B shows a panel 176 according to an alternative embodiment, where an entire row of semiconductor devices 150 share a single anchor pad extending generally across the width of panel 176. Thus, in the embodiment of FIG. 6B including two rows of semiconductor devices 150, there are two anchor pads 164. FIG. 6C shows a further embodiment of a panel 176, where the top row of semiconductor devices are wire bonded to the substrate along their bottom edge, and the bottom row of semiconductor devices are wire bonded to the substrate along their top edge. In such an embodiment, all semiconductor devices in the top row and all semiconductor devices in the bottom row may share a single anchor pad 164 between the rows and extending generally the length of the panel 176. Other configurations are contemplated where two or more semiconductor devices 150 share a common anchor pad 164 in a keep-out area 178.

In embodiments, after bond wires 170 are formed between the die in the die stack 153 and the anchor pads 164 on substrate 152, the substrate and die may be encapsulated in a molding compound 180 in step 252 as shown in the side and top views of FIGS. 7 and 8. Although not critical to the present invention, the molding compound 180 may be an epoxy resin such as for example available from Sumito Corp. or Nitto Denko Corp., both having headquarters in Japan. Other molding compounds from other manufacturers are contemplated. The molding compound may be applied according to various processes, including by transfer molding or injection molding techniques.

In further embodiments, the encapsulation process may be performed by FFT (Flow Free Thin) compression molding. Such an FFT compression molding process is known and described for example in a publication by Matsutani, H. of Towa Corporation, Kyoto, Japan, entitled "Compression Molding Solutions For Various High End Package And Cost Savings For Standard Package Applications," Microelectronics and Packaging Conference, 2009, which publication is incorporated by reference herein in its entirety.

The molding compound covers at least the passive components, the die in stack 153 and the bond wires 170. (These components would not be visible from the end and top views after the molding compound 180 is applied, but are shown in the figures for an understanding of the present disclosure).

After the semiconductor devices 150 on the panel 176 have been encapsulated in step 252, the respective devices may be singulated from the panel in step 256. In particular, the panel 176 may be cut both lengthwise and widthwise in the keep-out areas 178 between adjacent semiconductor devices 150. Each device 150 may be singulated by any of a variety of cutting methods including sawing, water jet cutting, laser cutting, water guided laser cutting, dry media cutting, and diamond coating wire cutting. While straight line cuts will define generally rectangular or square shaped devices 150, it is understood that device 150 may have shapes other than rectangular and square in further embodiments of the present invention.

A singulated semiconductor device 150 having a length L is shown in the side, top and end views of FIGS. 9, 10 and 11, respectively. As shown, the singulation step may remove the anchor pads 164 and saw through the bond wires 170 embedded in the molding compound 180. This leaves shortened bond wires 170 as seen in FIGS. 9 and 10. It also leaves the tail end of bond wires 170 exposed from a surface 182 of the molding compound along the singulation cut as seen in FIG. 11. As also seen for example in FIGS. 9-11, the singulation cut may also cut through a portion of the contact pads 162, leaving them exposed from the surface 182 as well.

After singulation in step 256, external connectors 184 may be applied to the outer surface of the molding compound in step 260 so as to connect the tail ends of the exposed bond wires 170 to their appropriate contact pad 162 to form a functioning semiconductor device. The external connectors 184 are shown in the side, top, end and perspective views of FIGS. 12, 13, 14 and 15, respectively. The external connectors may be formed of a variety of electrically conductive materials and applied by a variety of methods. As non-limiting examples of materials, the external connectors may be formed of copper, solder or Ni/Au plating material. As non-limiting examples of formation methods, the external connectors may be applied by lithography and other printing methods, electroforming and other metallization methods, thin film deposition such as physical vapor deposition and chemical vapor deposition, and soldering. Other electrically conductive materials and formation methods are contemplated.

Figure 15:
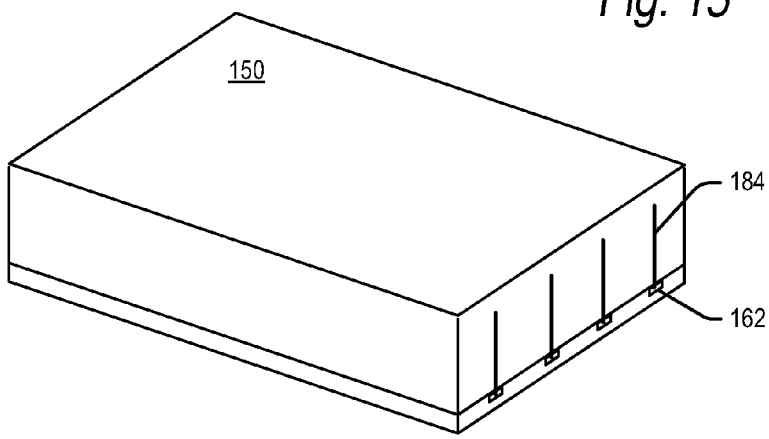
FIG. 15 is a perspective view of the semiconductor device shown in FIG. 12.
Figure 16:
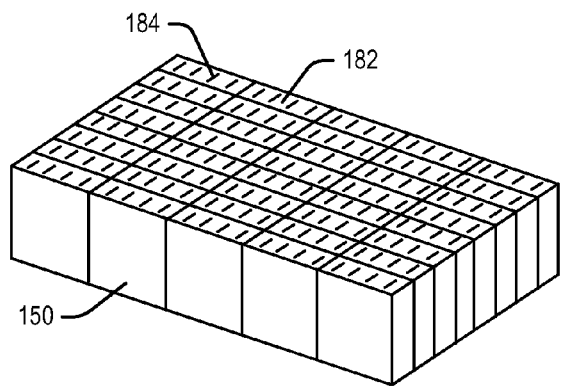
FIG. 16 is a perspective view of a number of semiconductor devices stacked in an array for the formation of the external connectors.
Figure 17:
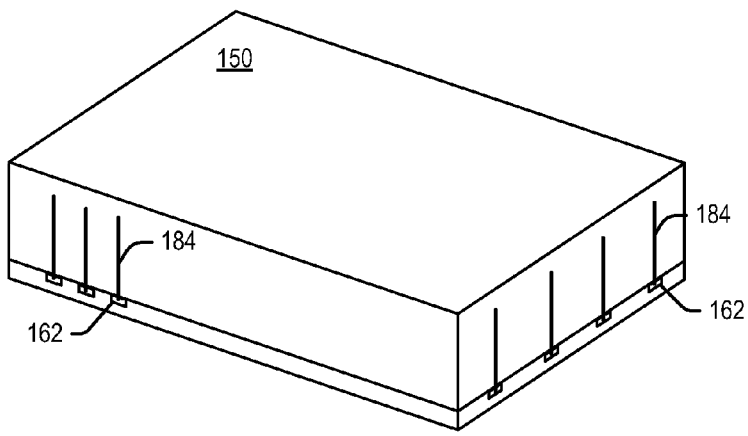
FIG. 17 is a perspective view of an alternative embodiment of a semiconductor device including external connectors on at least two sides of the semiconductor device.
Figure 18:
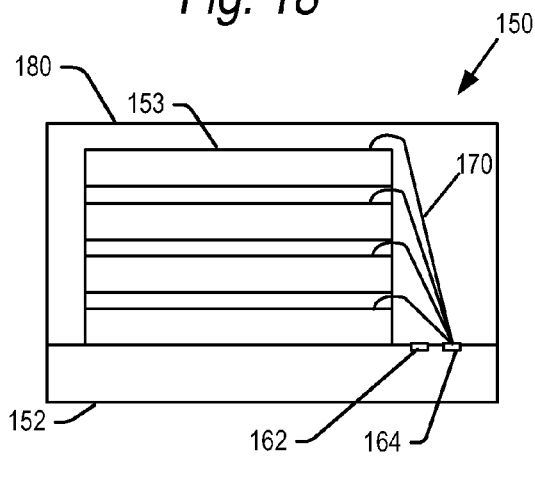
FIGS. 18, 19 and 20 are side, top and end views, respectively, of a semiconductor device according to an alternative embodiment of the present disclosure.
Figure 19:
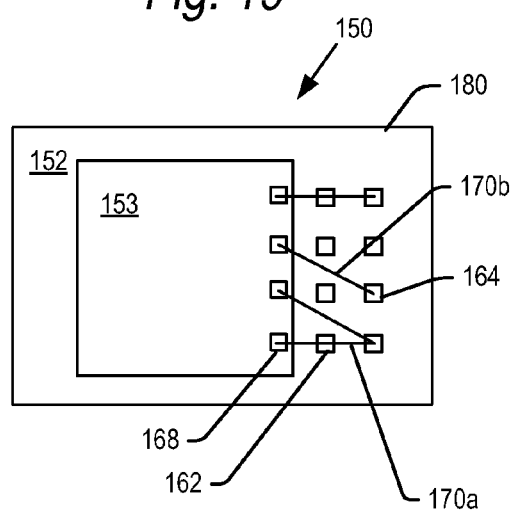
Figure 20:
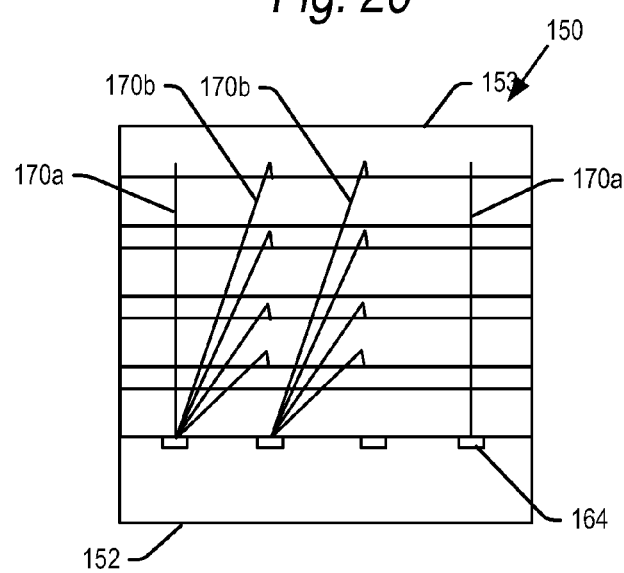

As described above, in one embodiment, the bond wires 170 extended from vertically aligned die bond pads 168 on each die in the die stack 153 to a common anchor pad 164. Accordingly, in such embodiments, upon singulation, the tail ends of bond wires 170 from a set of vertically aligned die bond pads may also align vertically with each other as seen in FIG. 11. Moreover, in embodiments, these vertically aligned tail ends may also align over a contact pad 162 on the substrate 152. Accordingly, in embodiments, the respective external connectors 184 may connect the appropriate tail ends of bond wires 170 with a single, straight length of material, as seen in FIGS. 14 and 15. As explained in greater detail below, the external connectors may connect a group of wire bond tail ends to a contact pad using other than a straight line of material in further embodiments.

The external connectors 184 may be applied to surfaces of multiple semiconductor devices simultaneously to achieve economies of scale and efficiencies. As shown in the perspective view of FIG. 16, after singulation, an array of semiconductor devices 150 may be aligned with each other in an array of multiple rows and columns, with the exposed surface 182 to receive the external connector all facing the same direction, e.g., upward. The external connectors may then be applied to the exposed surfaces 182 of all semiconductor devices in the array at the same time. In one example, one-hundred semiconductor devices may be provided in an array to receive the external connectors all at once, though the number in the array may be more or less than that in further examples.

In embodiments, a width of the external connectors 184 may be close to the diameter of the bond wires 170 as shown in the figures. However, to provide greater tolerances, the external connectors 184 may have a larger width than the diameter of the bond wires 170. An external connector 184 may be provided with a width which allows electrical connection of all appropriate bond wires 170 to their appropriate contact pad 162, while being electrically isolated from other external connectors 184 and bond wires not to be electrically connected to that contact pad 162.

In embodiments, after formation of the external connectors 184, the external connectors may be covered with a protective layer which may be a conformal coating, ink or adhesive cover to hide and protect the external connectors. The protective layer may be omitted in further embodiments.

Using the above-described steps, a semiconductor device may be fabricated having a smaller footprint than allowed by conventional fabrication methods. In one example of conventional semiconductor devices, at least 600 μm is required between an edge of the die stack (off of which wire bonds are formed) and the adjacent surface of molding compound. Using the present technology, the distance may be reduced to 100 μm between an edge of the die stack (off of which wire bonds are formed) and the adjacent surface 182 of molding compound. These numbers for conventional devices and devices according to the present technology are by way of example only. The distances between an edge of the die stack off of which wire bonds are formed and the adjacent surface 182 of molding compound may be larger than 100 μm, or reduced to less than 100 μm, in further embodiments of the present technology.

The present technology provides benefits beyond merely a reduction in size of a semiconductor device. For example, as the finished bond wires are shorter than in conventional designs, they may be placed closer together than in conventional designs. This allows a more dense configuration of die bond pads on the die, and contact pads on the substrate. Moreover, the present technology provides greater flexibility with respect to routing electrical signals from the die to the substrate. Where conventional designs have two-dimensional routing (in the plane of the substrate only), the present technology enables three-dimensional routing. Routing may take place in the plane of the substrate, but also along the walls (sides and top) of the molding compound. Thus, circuit designers can design a three dimensional routing scheme with greater flexibility and possibilities than were possible with conventional semiconductor device designs. Non-limiting examples of such designs are explained below.

In the example described above, bond wires 170 are formed off of a single edge of the die stack 153. However, it is understood that bond wires 170 may be formed off of two opposed or adjacent edges, three edges, or all four edges around the die stack 153. In such embodiments, bond wires 170 may be made to anchor pads 164 in a keep-out area 178, and then truncated during singulation as described above. Thereafter, external connectors may be formed on each edge including truncated bond wires 170. In one example shown in FIG. 17, bond wires 170 are formed off of two adjacent edges. Thus, in this embodiment, two adjacent edges including external connectors 184 connect the tail ends of bond wires 170 to contact pads 162.

As noted, in the above-described embodiments, wire bonds are formed vertically between die bond pads that are vertically aligned with each other and with the contact and anchor pads 162, 164. However, it may be otherwise in further embodiments. For example, as shown in the side, top and end views of FIGS. 18, 19 and 20, a first set of bond wires 170a are formed between vertically aligned die bond pads 168 and anchor pads 164, but a second set of bond wires 170b are formed between die bond pads 168 that are not vertically aligned with an anchor pad 164 to which they connect.

As a consequence of the diagonal bond wires 170b, when the semiconductor device 150 is encapsulated and singulated to leave tail ends of the wire bonds in a surface 182, some of the tail ends will not align vertically over a contact pad 162. This example is shown in the side, top and end views of FIGS. 21, 22 and 23, respectively. As seen in FIGS. 22 and 23, the tail ends of vertically aligned bond wires 170a align over their associated contact pad 162, but the tail ends of bond wires 170b do not vertically align over their associated contact pads 162.

Accordingly, in this embodiment, the non-aligned bond wires 170b may be connected to their associated contact pads 162 with discontinuous segments of the external connectors. For example, FIG. 24 shows diagonal segments 184b of the external connectors. FIGS. 21-24 provide one example, and it is understood that external connectors 184 may have a wide variety of other configurations of discontinuous segments in further embodiments.

Figure 25:
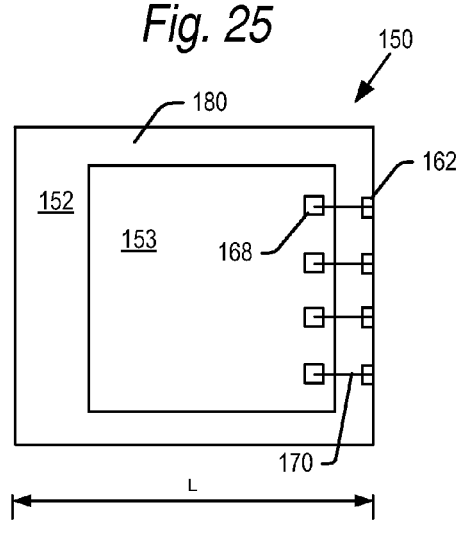
FIGS. 25 and 26 are top and end views of a singulated semiconductor device including bond wires exposed in an outer surface of the molding compound.
Figure 26:
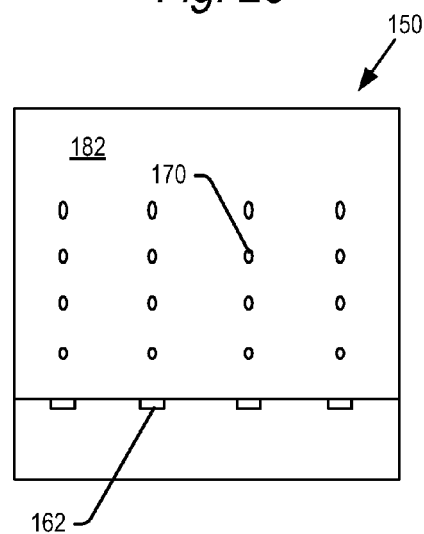
Figure 27:
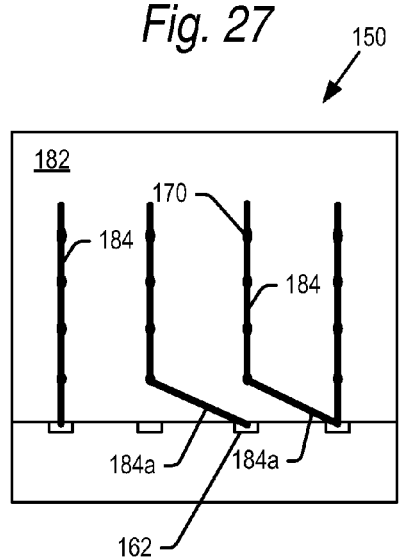
FIG. 27 is an end view as in FIG. 26, further showing external connectors connecting the exposed bond wires on the outer surface of the molding compound to the substrate.
Figure 28:
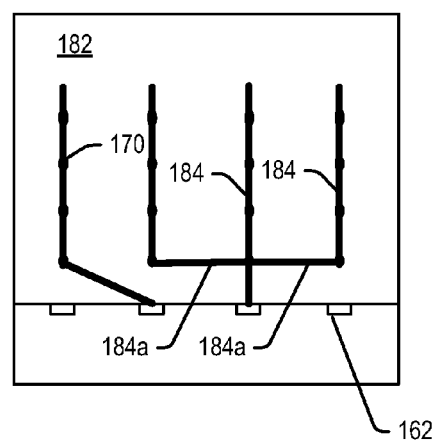
FIG. 28 is an end view showing an alternative external connectors configuration to that shown in FIG. 27.

In another example, all bond wires 170 may be vertically aligned within the die stack and with respective anchor pads 164 to result in vertically aligned tail ends of bond wires 170, as shown in the top and end views of FIGS. 25 and 26. However, it may be that the circuit layout has the external connectors connecting the tail ends of a column of bond wires 170 to contact pads 162 other than those with which they are aligned. Two such examples are shown in the end views of FIGS. 27 and 28. In the example of FIG. 27, two columns of bond wires 170 are connected by diagonal segments 184a to non-aligned contact pads 162. In the example of FIG. 28, two columns of bond wires 170 are connected by horizontal segments 184a to a non-aligned contact pad 162. The external connectors add a degree of flexibility in the layout of the circuit design not available in conventional designs.

Figure 29:
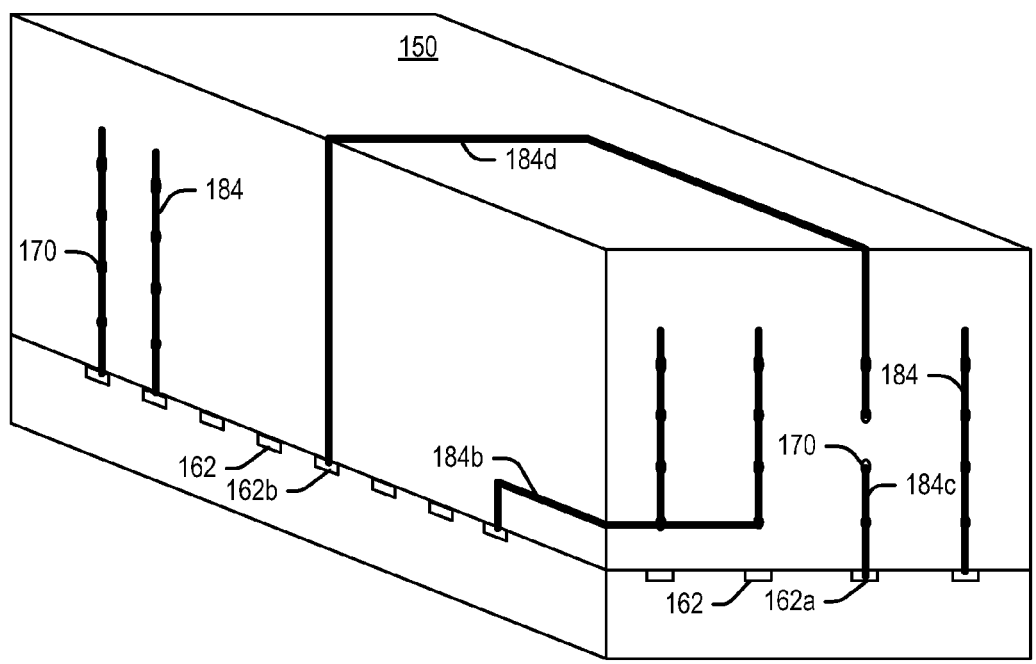
FIG. 29 is a perspective view of a semiconductor device according to a further embodiment showing external connectors extending from one surface to another surface of the molding compound.

FIG. 29 illustrates a further degree of flexibility where external connectors 184 may be used to connect the tail ends of wire bonds not just to non-aligned contact pads, but to non-aligned contact pads located on a completely different side of the semiconductor device 150. In the example shown, one external connector segment 184b connects two columns of bond wires to a die bond pad 168 in an adjacent side of the semiconductor device 150. Moreover, while it may generally be that all wire bonds in a column of wire bonds get connected to the same contact pad 162, it may be otherwise in further examples. FIG. 29 shows a first group of bond wires 170 in a column of wire bonds being connected to a first contact pad 162a via an external connector 184c, and a second group in the column being connected to a second contact pad 162b via an external connector 184d on a different side of the semiconductor device 150. Again, as seen, the external connectors add great flexibility in the layout of the circuit design and allow multi-dimensional electrical connections to be formed connecting die bond pads 168 to contact pads 162 in a wide variety of configurations. The example in FIG. 29 shows a few examples, but a great many other configurations are possible and contemplated.

Once the electrical connections are made via external connectors 184, the semiconductor devices may be tested in a step 264 to determine whether the packages are functioning properly. As is known in the art, such testing may include electrical testing, burn in and other tests.

In summary, the present technology relates to a memory device comprising: a substrate including a plurality of contact pads; one or more semiconductor die including a plurality of die bond pads; a molding compound encapsulating the one or more semiconductor die; and an electrical circuit electrically coupling a contact pad of the plurality of contact pads with a die bond pad of the plurality of die bond pads, at least a portion of the electrical circuit formed on at least one outer surface of the molding compound.

In another example, the present technology relates to a memory device, comprising: a substrate including a plurality of contact pads; one or more semiconductor die including a plurality of die bond pads; a molding compound encapsulating the one or more semiconductor die; and an external connection provided on one or more surfaces of the molding compound for communicating electrically coupling a contact pad of the plurality of contact pads with a die bond pad of the plurality of die bond pads.

In a further example, the present technology relates to a memory device, comprising: a substrate including a plurality of contact pads; one or more semiconductor die including a plurality of die bond pads; a molding compound encapsulating the one or more semiconductor die, a contact pad of the plurality of contact pads having an edge exposed at a surface of the molding compound.

In a further example, the present technology relates to a memory device, comprising: a substrate including a plurality of contact pads; a plurality of semiconductor die, each die in the plurality of semiconductor die including a plurality of die bond pads; a molding compound encapsulating the one or more semiconductor die; a plurality of bond wires each having a first end electrically coupled to a die bond pad of the plurality of die bond pads, and each having a second, tail end opposite the first end terminating at a surface of the molding compound; and a plurality of external connections provided on one or more surfaces of the molding compound, the plurality of external connections electrically connecting the plurality of bond wires to the plurality of contact pads on the substrate.

In another example, the present technology relates to a method of forming a semiconductor device, comprising: (a) mounting one or more semiconductor die on a substrate; (b) wire bonding the semiconductor die to the substrate; (c) encapsulating the one or more semiconductor die and bond wires; (d) singulating the encapsulated semiconductor die by in part severing the wire bonds formed in said step (b); and (e) electrically connecting the severed wire bonds to the substrate.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory device, comprising:
a substrate including a plurality of contact pads;
one or more semiconductor die including a plurality of die bond pads;
a molding compound applied on the substrate and encapsulating the one or more semiconductor die, the molding compound and substrate together forming a flat planar surface upon singulation of the molding compound and substrate together, a contact pad of the plurality of contact pads having a severed edge exposed at the flat planar surface of the molding compound; and
an external connection provided on one or more surfaces of the molding compound for electrically coupling the contact pad with a die bond pad of the plurality of die bond pads.

2. The device of claim 1, wherein the external connection terminates at a contact pad at the flat planar surface of the molding compound and starts on the same flat planar surface.

3. The device of claim 1, wherein the external connection terminates at a contact pad on a first surface of the memory device and starts on the flat planar surface of the molding compound different than the first surface.

4. The device of claim 1, wherein the external connection extends in a straight line from its start to its finish in contact with the contact pad.

5. The device of claim 1, wherein the external connection includes a first portion extending from its start and a second portion terminating at the contact pad, the first and second portions extending at discontinuous angles with respect to each other.

6. The device of claim 1, wherein the one or more semiconductor die include at least two stacked semiconductor die.

7. The device of claim 6, further comprising electrical leads extending from die bond pads on each of the at least two stacked semiconductor die, the electrical leads terminating at a surface of the molding compound, the external connectors electrically connecting the electrical leads to at least one contact pad of the plurality of contact pads.

8. The device of claim 1, further comprising a wire bond having a first end electrically connected to the die bond pad and a second tail end, opposite the first end, terminating at a surface of the molding compound.

9. A memory device, comprising:
a substrate including a plurality of contact pads;
one or more semiconductor die including a plurality of die bond pads;
a molding compound applied on the substrate and encapsulating the one or more semiconductor die, the molding compound and substrate together forming a flat planar surface upon singulation of the molding compound and substrate together, a contact pad of the plurality of contact pads having a severed edge exposed at the flat planar surface of the molding compound; and
a wire bond having a first end electrically connected to the die bond pad and a second tail end, opposite the first end, terminating at a surface of the molding compound.

10. The device of claim 9, wherein the external connection terminates at a contact pad at the flat planar surface of the molding compound and starts on the same flat planar surface.

11. The device of claim 9, wherein the external connection terminates at a contact pad on a first surface of the memory device and starts on the flat planar surface of the molding compound different than the first surface.

12. The device of claim 9, wherein the external connection extends in a straight line from its start to its finish in contact with the contact pad.

13. The device of claim 9, wherein the external connection includes a first portion extending from its start and a second portion terminating at the contact pad, the first and second portions extending at discontinuous angles with respect to each other.

14. The device of claim 9, wherein the one or more semiconductor die include at least two stacked semiconductor die.

15. The device of claim 14, further comprising electrical leads extending from die bond pads on each of the at least two stacked semiconductor die, the electrical leads terminating at a surface of the molding compound, the external connectors electrically connecting the electrical leads to at least one contact pad of the plurality of contact pads.

* * * * *